US007823046B2

(12) United States Patent
Hirabayashi

(10) Patent No.: US 7,823,046 B2
(45) Date of Patent: Oct. 26, 2010

(54) SEMICONDUCTOR DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 2200 days.

(21) Appl. No.: 10/443,068

(22) Filed: May 22, 2003

(65) Prior Publication Data

US 2004/0193966 A1 Sep. 30, 2004

(30) Foreign Application Priority Data

Mar. 13, 2003 (JP) ............................ 2003-067906

(51) Int. Cl.
*G11C 29/00* (2006.01)

(52) U.S. Cl. ...................................... 714/764; 714/704

(58) Field of Classification Search ................. 714/764, 714/704
See application file for complete search history.

(56) References Cited

U.S. PATENT DOCUMENTS

| | | | | |
|---|---|---|---|---|
| 4,617,674 | A * | 10/1986 | Mangulis et al. | 375/141 |
| 4,688,219 | A * | 8/1987 | Takemae | 714/711 |
| 4,780,875 | A * | 10/1988 | Sakai | 714/757 |
| 4,942,556 | A * | 7/1990 | Sasaki et al. | 365/200 |
| 5,228,046 | A * | 7/1993 | Blake et al. | 714/761 |
| 5,553,231 | A * | 9/1996 | Papenberg et al. | 714/5 |
| 5,646,948 | A * | 7/1997 | Kobayashi et al. | 714/719 |
| 5,671,239 | A * | 9/1997 | Higashitani et al. | 714/805 |
| 5,712,861 | A * | 1/1998 | Inoue et al. | 714/752 |
| 5,745,506 | A * | 4/1998 | Yamashita et al. | 714/760 |
| 5,868,195 | A * | 2/1999 | Westbrooks, Jr. | 165/267 |
| 5,878,098 | A * | 3/1999 | Wang et al. | 375/377 |
| 5,968,195 | A * | 10/1999 | Ishiyama | 714/727 |
| 6,161,209 | A * | 12/2000 | Moher | 714/780 |
| 6,233,717 | B1 * | 5/2001 | Choi | 714/805 |
| 6,262,925 | B1 * | 7/2001 | Yamasaki | 365/200 |

(Continued)

FOREIGN PATENT DOCUMENTS

JP 1-223700 9/1989

(Continued)

OTHER PUBLICATIONS

U.S. Appl. No. 10/739,123, filed Dec. 19, 2003, Hirabayashi.

(Continued)

*Primary Examiner*—Scott T Baderman
*Assistant Examiner*—Enam Ahmed
(74) *Attorney, Agent, or Firm*—Oblon, Spivak, McClelland, Maier & Neustadt, L.L.P.

(57) ABSTRACT

A semiconductor device has a memory section including a first and second memory cell storing a data bit and error correcting bit, respectively. An error correcting section outputs a data signal containing an error-corrected data bit, using the error correcting bit and an information signal when the error is corrected. A test section outputs a first determination signal when the memory section is determined to be faulty by checking the data signal based on a program. A counter section counts the number of times by which the information signal is supplied thereto and outputs a second determination signal when the result of counting becomes equal to a reference value. A determining section determines that the memory section is faulty when one of the first and second determination signals is supplied thereto.

12 Claims, 5 Drawing Sheets

U.S. PATENT DOCUMENTS

| | | | | |
|---|---|---|---|---|
| 6,567,323 | B2 * | 5/2003 | Pitts et al. | 365/200 |
| 6,917,967 | B2 * | 7/2005 | Wu et al. | 709/213 |
| 6,973,608 | B1 * | 12/2005 | Abramovici et al. | 714/725 |

FOREIGN PATENT DOCUMENTS

| | | |
|---|---|---|
| JP | 3-87000 | 4/1991 |
| JP | 4-349549 | 12/1992 |
| JP | 5-81855 | 4/1993 |
| JP | 6-175934 | 6/1994 |

OTHER PUBLICATIONS

U.S. Appl. No. 10/805,227, filed Mar. 22, 2004, Hirabayashi.

* cited by examiner

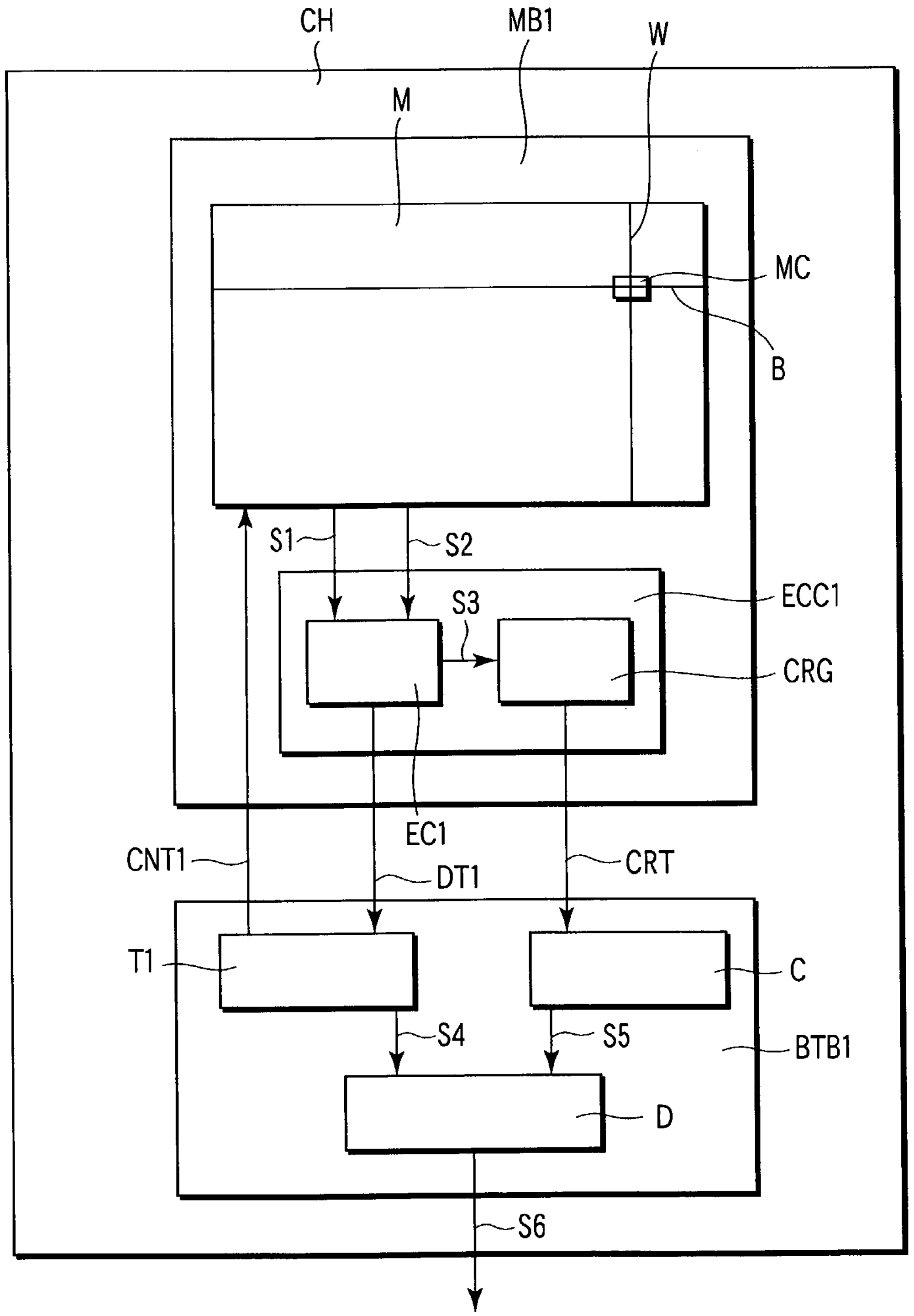
F I G. 1

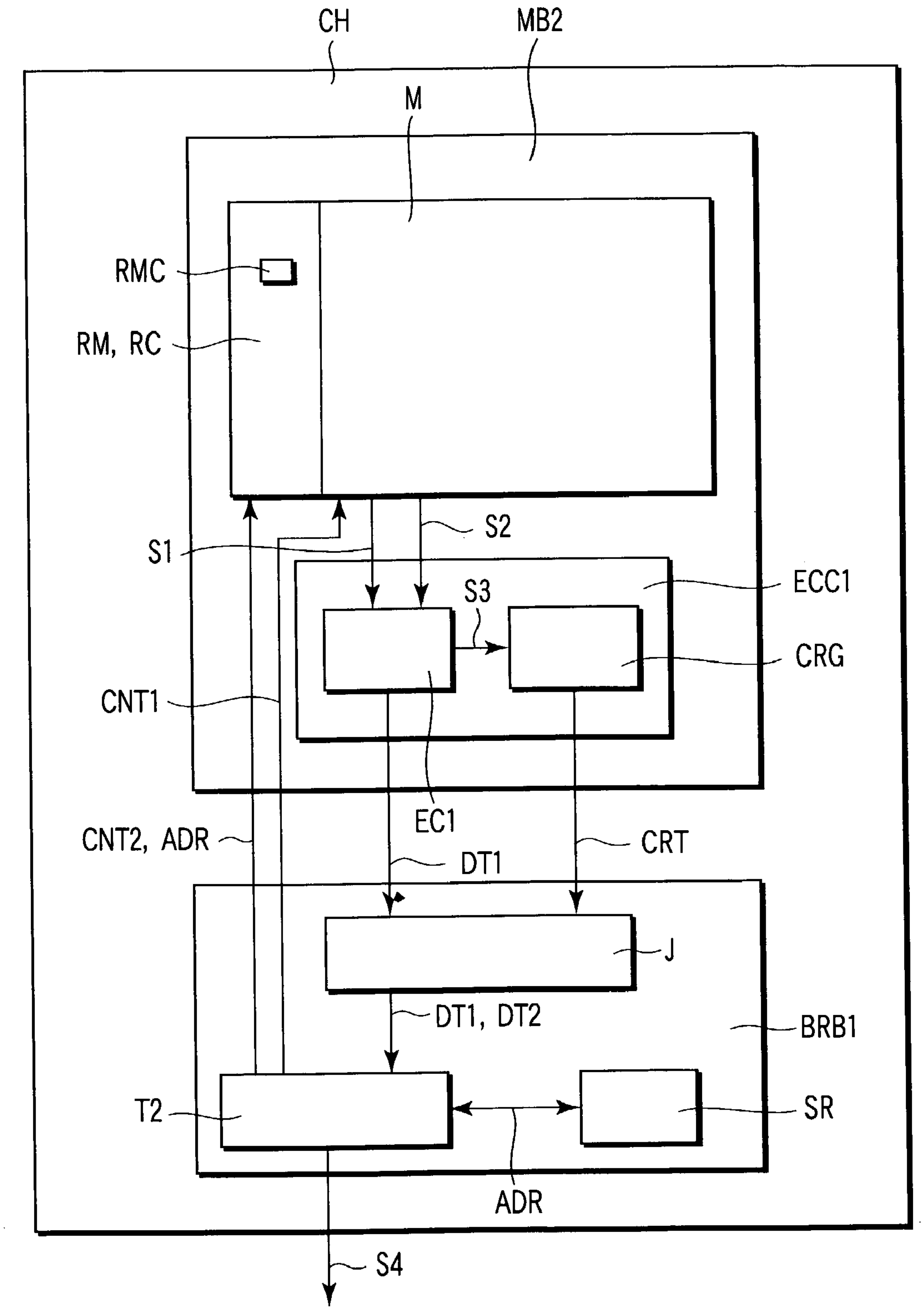
F I G. 2

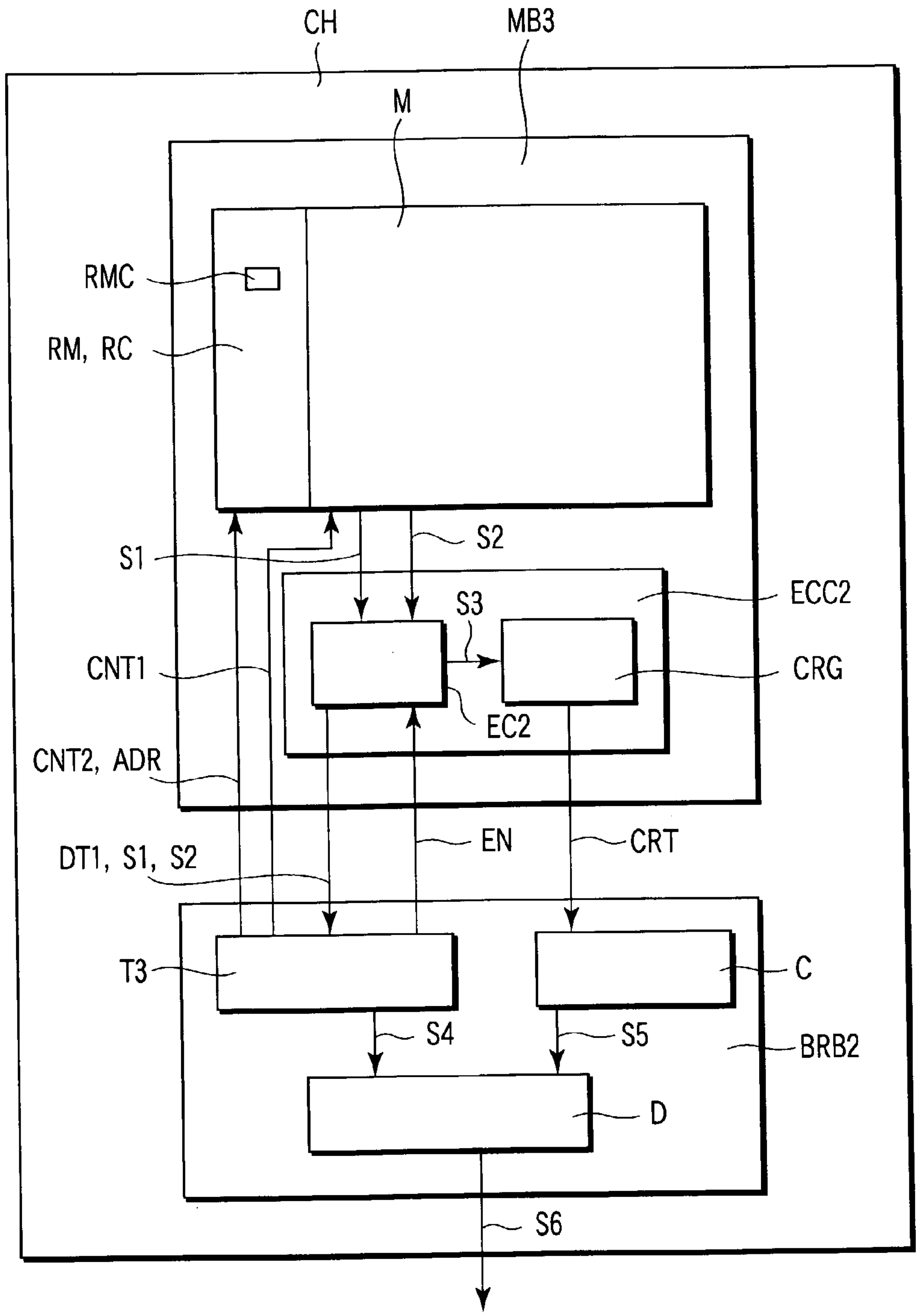
F I G. 3

SEMICONDUCTOR DEVICE

CROSS-REFERENCE TO RELATED APPLICATIONS

This application is based upon and claims the benefit of priority from the prior Japanese Patent Application No. 2003-067906, filed Mar. 13, 2003, the entire contents of which are incorporated herein by reference.

BACKGROUND OF THE INVENTION

1. Field of the Invention

The present invention relates to a semiconductor device and more particularly to a semiconductor device having an error correcting system in which a memory block which is one of a plurality of functional blocks in a system LSI utilizes an ECC (Error Correction Code).

2. Description of the Related Art

A so-called system LSI (Large Scale Integrated Circuit) in which a memory, logic circuit and the like are integrated on one system chip to form one system is known. In a system LSI, a plurality of functional blocks (core, macro, IP (Intellectual Property)) such as memory circuits, logic circuits are formed on a semiconductor chip to configure a desired system as a whole.

As a memory block which is one of the IPs is miniaturized, a soft error develops into a serious problem. In order to avoid the soft error problem, it is known to use an error correcting system using ECCs (which is hereinafter referred to as an ECC system). In the ECC system, an error correcting bit (parity bit) is added to data read from a memory cell. An error correcting section in the memory block detects an error of the data bit and the position thereof by use of an error correcting bit and transmits a signal having the error corrected.

Further, a BIST (Built-In Self-Test) block is known as one of the IPs. In the BIST block, a program required for the operation test of the memory block is previously stored. The BIST block automatically makes a test (checking operation) for each memory cell in the memory block according to the program and outputs a test result (for example, whether the memory block is good or faulty).

Also, a BISR (Built-In Self-Repair) block is known as one of the IPs. When the memory block has a repair system (which is hereinafter referred to as a redundancy system) using redundant memory cells, the BISR block determines the position of a faulty memory cell by use of the same method as in the BIST block and controls the memory block so as to replace the faulty memory cell by a redundant memory cell.

A plurality of IPs are provided on the substrate to configure a desired system, but a problem may occur depending on the combination of IPs in some cases.

FIG. 4 schematically shows the configuration when a memory block 1 having the ECC system with the above configuration is combined with a BIST block 2. As shown in FIG. 4, a memory section 11 in the memory block 1 supplies a data bit signal 21 and correction bit signal 22 to an error correcting section 12 according to a control signal 24 from the BIST block 2. The error correcting section 12 detects and corrects an error in the data bit signal 21 and supplies a signal 23 containing a data bit which reflects the error correction to the BIST block 2. The BIST block 2 makes a self-test by use of the signal 23.

However, the BIST block 2 checks the signal 23 which is subjected to error correction (which is hereinafter referred to as ECC correction) by the ECC system by making the combination of FIG. 4. Therefore, the following problems occur.

A case wherein the memory section 11 has a capacity of 1 Mb configured by 1 k word lines×1 k bit lines is explained. It is assumed that the memory is configured so that a group of data bits (which is hereinafter referred to as a word) from 128 memory cells among data of the memory cells connected to one selected word line will be simultaneously output to the exterior of the memory section 11. Further, it is assumed that the number of bits which can be ECC-corrected is one bit for each word (=128 bits) and one bit of the memory section 11 is faulty due to a faulty portion occurring in the manufacturing process. In this case, an error of one bit always occurs in the data bit signal 21 containing the faulty bit, but the error can be ECC-corrected. Therefore, the BIST block 2 determines the memory block 1 as a good product even though a faulty portion occurs in the memory section 11.

However, since the ECC correction cannot be further made for the word containing the error-corrected bit, no error correction is made even if a soft error occurs in the word. When the number of such words is extremely large, the number of words which can be subjected to error correction for the soft error is reduced, and therefore, the memory block 1 becomes less resistant to soft errors as a whole.

Further, as shown in FIG. 5, the same type of problem as described above occurs when a BISR block 4 is used instead of the BIST block 2 by using a memory block 3 having a redundancy system. That is, a faulty memory cell which is ECC-corrected is not dealt with as a memory cell which is to be repaired by the redundancy system as the test result by the BISR block 4. Therefore, the memory block 3 is less resistant to soft errors.

BRIEF SUMMARY OF THE INVENTION

According to a first aspect of the present invention, there is provided a semiconductor device comprising: a memory section including first memory cell which stores a data bit and a second memory cell which stores an error correcting bit, an error correcting section which corrects an error of the data bit by use of the error correcting bit, outputs a data signal containing an error-corrected data bit and an information signal when the error is corrected, a test section which is supplied with the data signal and the information signal and outputs a first determination signal when the memory section is determined to be faulty by checking the data signal based on a program previously stored therein, a counter section which counts the number of times by which the information signal is supplied thereto and outputs a second determination signal when the result of counting is equal to a predetermined reference value, and a determining section which determines that the memory section is faulty when one of the first and second determination signals is supplied thereto.

According to a second aspect of the present invention, there is provided a semiconductor device comprising: a memory section including a plurality of first memory cells each of which stores a data bit and a second memory cell which stores an error correcting bit, a redundant memory section including a plurality of redundant memory cells each of which can be used to replace the first memory cell and stores the data bit instead of the replaced first memory cell, a redundancy control section which performs a replacement operation which forms a signal path to replace the faulty first memory cell by the redundant memory cell according to a control signal, an error correcting section which corrects an error in a data bit group consisting of the data bits by use of the error correcting bit, outputs a first data signal containing an error-corrected data group and outputs an information signal when the error is corrected, a determining section which monitors the information signal and outputs a second data signal which has information attached to the first data signal and indicating that the first data signal contains the error-corrected data group when the first data signal contains the error-corrected data group, and a test section which checks the second data signal based on a program previously stored therein and outputs the control signal which controls the redundancy control section to replace the first memory cell which stores the data bit containing an error by the redundant memory cell when the error is detected in the data group of the second data signal.

According to a third aspect of the present invention, there is provided a semiconductor device comprising: a memory section including a plurality of first memory cells each of which stores a data bit and a second memory cell which stores an error correcting bit and outputting a first signal which contains a data group containing a plurality of the data bits and a second signal which contains the error correcting bit, a redundant memory section including a plurality of redundant memory cells each of which can be used to replace the first memory cell and stores the data bit instead of the replaced first memory cell, a redundancy control section which performs a replacement operation which forms a signal path to replace the faulty first memory cell by the redundant memory cell according to a control signal, an error correcting section which is supplied with the first and second signals, has a first mode and second mode, outputs the first and second signals as they are in the first mode, corrects an error in the data group by use of the error correcting bit and outputs a first data signal containing an error-corrected data group in the second mode, and outputs an information signal when the error is corrected, and a test section which checks the first signal based on a program previously stored therein in the first mode and outputs the control signal which controls the redundancy control section to replace the first memory cell which stores the data bit containing an error by the redundant memory cell when the error is detected in the data group of the first signal.

BRIEF DESCRIPTION OF THE SEVERAL VIEWS OF THE DRAWING

FIG. 1 is a functional block diagram schematically showing a semiconductor device according to a first embodiment of the present invention, FIG. 2 is a functional block diagram schematically showing a semiconductor device according to a second embodiment of the present invention, FIG. 3 is a functional block diagram schematically showing a semiconductor device according to a third embodiment of the present invention.

DETAILED DESCRIPTION OF THE INVENTION

Figure 4:
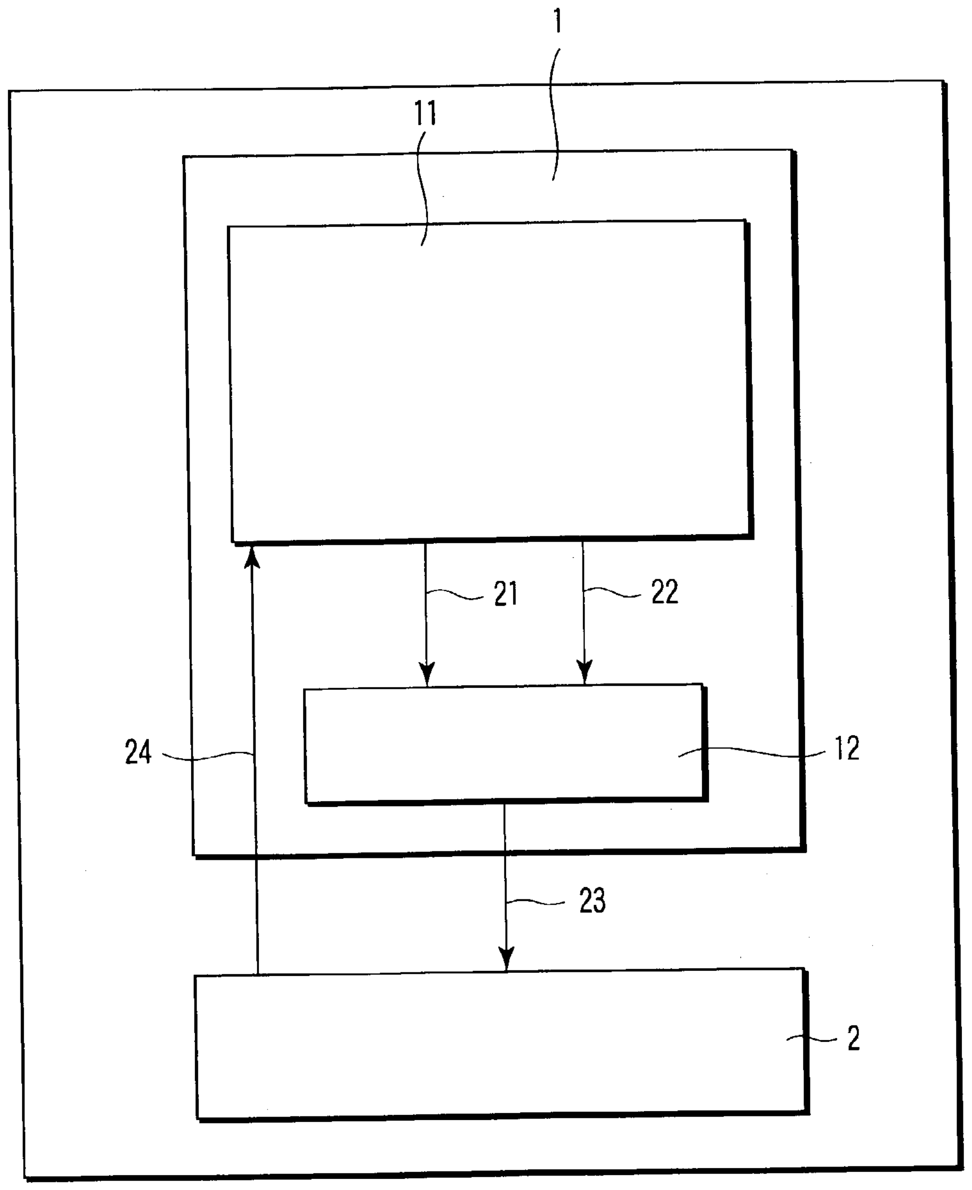
FIG. 4 is a block diagram schematically showing a conventional semiconductor device.
Figure 5:
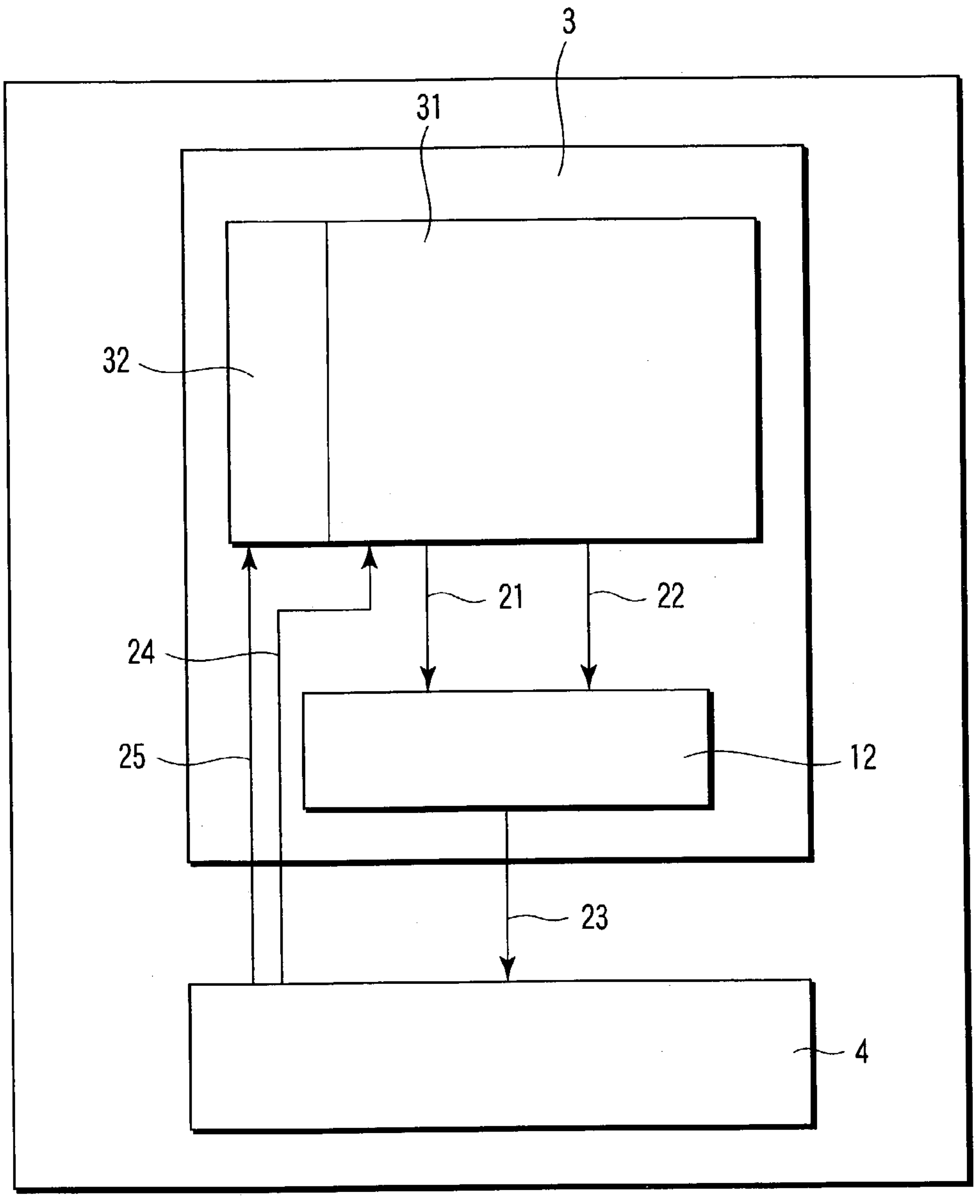
FIG. 5 is a block diagram schematically showing another conventional semiconductor device.

There will now be described embodiments of the present invention with reference to the accompanying drawings. In the following explanation, the same reference symbols are attached to portions which have substantially the same function and configuration and repetitive explanations are made only when necessary.

First Embodiment

FIG. 1 is a diagram schematically showing a semiconductor device according to a first embodiment of the present invention. As shown in FIG. 1, the semiconductor device has a system chip (substrate) CH and functional blocks are provided on the system chip CH. The functional blocks are provided in regions surrounded by a region (boundary region) in which no functional blocks are formed. In other words, the boundary region separates functional regions from one another on a semiconductor chip C and the functional blocks are formed in the respective function regions. As the functional blocks, a memory block MB1, BIST block BTB1 are provided.

The memory block MB1 has a memory section M and error correcting section ECC1. The memory section M is configured to have functions of programming data into a memory cell MC of a preset address based on a signal supplied from the exterior and reading information from the memory cell MC. Typically, it includes a memory cell array, decoder, input/output control circuit (which are not shown in FIG. 1) and the like. The memory cell array has word lines W and bit lines B and the word lines W and bit lines B are arranged in a lattice form. The memory cells MC are provided at respective intersections between the word lines W and the bit lines B.

The memory section M supplies a data bit signal S1 containing data bits (data bit group) of a preset number of bits (for example, N bits) stored in the memory cells MC to the error correcting section ECC1 according to a control signal CNT1 from the BIST block BTB1. Further, the memory section M outputs a correction bit signal S2 containing error correcting bits (error correcting bit group) of, for example, P bits to the error correcting section ECC1. The error correcting bits are used to correct an error of data in the data bits and can utilize various types of known error correcting codes. It is also possible to form one signal by making the data bits and error correcting bits successive to each other.

The data bit signal S1 and correction bit signal S2 are supplied to a correcting section EC1 in the error correcting section ECC1. The correcting section EC1 detects the presence or absence of an error in the data bits and the position of an error if the error is present by testing the error correcting bits. After this, it corrects the error and outputs a data signal DT1 containing the N-bit data bits on which the correction is reflected.

Further, the correcting section EC1 supplies a signal S3 to an information signal forming section CRG each time it makes an ECC correction. When receiving the signal S3, the information signal forming section CRG outputs an information signal CRT to the effect that the ECC correction has been made.

The BIST block BTB1 includes a test section T1, counter section C and determining section D. The data signal DT1 is supplied to the test section T1. The test section T1 is set into a test mode in response to a signal from the exterior at the test time of the semiconductor device or the like. In the test mode, the test section T1 controls the memory block to test the data signal DT1 by use of the control signal CNT1 based on a program previously stored in the test section T1. That is, the test section determines whether or not the memory cell is correctly operated by, for example, programming data in a preset bits, then reading out the programmed data and verifying the readout data. For example, the tests are sequentially made for all of the memory cells MC for every N-bit data bits (for each word). As the test result, if it is determined that the memory block MB1 is faulty by checking whether or not the memory block satisfies a preset reference condition, the test section T1 outputs a first determination signal S4 containing information to that effect.

An information signal CRT is supplied to the counter section C. For example, the counter section C is configured by a variable X-bit counter to count the number of times by which the information signal CRT is supplied thereto and output a second determination signal S5 containing information indicating that the counting result reaches an upper limit when the counting result reaches the upper limit, for example.

The upper limit of the counter C is determined according to the extent of the capacity which should be prepared to be used for ECC-correction (the capacity of the ECC system) for soft errors by taking a required soft error rate (SER) into consideration, for example. For example, it is assumed that it has a configuration of 8 k words×128 bits (one word) having 1M memory cells. In this case, if the upper limit of the counter C is set to "100", for example, an ECC correction for (8 k−100) words can be made. The ability of ECC correction is reduced by (8 k−100)/8 k=0.988 times and is not substantially lowered, and therefore, a soft error correction can be sufficiently made. Further, it can also be determined by taking a required manufacturing yield into consideration.

The first determination signal S4 and second determination signal S5 are supplied to the determining section D. When receiving one of the first determination signal S4 and second determination signal S5, the determining section D outputs a signal S6 indicating that the memory block MB1 is faulty to a tester or the like. Typically, the determining section D can be configured by an OR circuit.

According to the semiconductor device of the first embodiment, the BIST block BTB1 counts the number of times by which the error correcting section ECC1 of the memory block MB1 makes an ECC correction and outputs the signal S6 indicating that the memory block MB1 is faulty when the counting result reaches a preset value. Therefore, when the number of memory cells MC having faulty portions caused in the manufacturing process is equal to or larger than a preset value in the memory block MB1, the memory block MB1 is determined to be faulty. Thus, the memory block MB1 containing a relatively large number of faulty memory cells is determined to be faulty before most part of the capacity of the ECC system is used up to repair or compensate for the faulty portions caused in the manufacturing process in the memory block MB1. Therefore, the capacity of the ECC system can be maintained to compensate for soft errors, and as a result, a semiconductor device which is highly resistant to soft errors can be provided.

For example, when a faulty portion is caused in an I/O in the manufacturing process in an ECC system in which one bit in each word can be ECC-corrected, all of the memory cells MC connected to the I/O do not correctly function in the worst case. In the case of the conventional ECC system, since each memory cell MC is ECC-corrected in a word to which the memory cell itself belongs, the memory block is determined as a good product as the result of self-test. However, since the capacity of the ECC system is used up in this word, it cannot cope with a soft error at all. On the other hand, according to the first embodiment of the present invention, since the memory block MB1 to be checked is determined to be faulty if the number of times by which the ECC correction is made becomes equal to or larger than a preset number, the above memory block MB1 can be excluded.

Second Embodiment

In the first embodiment, an example in which the present invention is applied to the semiconductor device using the BIST block is shown. On the other hand, the second embodiment is applied to a semiconductor device using a BISR block.

FIG. 2 is a functional block diagram schematically showing a semiconductor device according to the second embodiment of the present invention. As shown in FIG. 2, the semiconductor device includes a memory block MB2 having a redundancy system and a BISR block BRB1.

The memory block MB2 has a redundant memory section RM, redundancy system control section (redundancy control section) RC in addition to a memory section M and error correcting section ECC1 with the same configuration as those of the memory block MB1 of the first embodiment. Redundant memories RMC in the RM redundant memory section RM can be substituted for faulty memory cells MC and store data. The redundancy control section RC forms a signal path according to a control signal CNT2 and address signal ADR to replace the faulty memory cell by the redundant memory cell RC.

The BISR block BRB1 includes a test section T2, storage section SR and determining section J. An information signal CRT and data signal DT1 from the error correcting section ECC1 are supplied to the BISR block BRB1.

The data signal DT1 from a correcting section EC1 and the information signal CRT from an information signal generating section CRG are supplied to a determining section J in the BISR block BRB1. The determining section J determines whether or not the supplied data signal DT1 is ECC-corrected by use of the information signal CRT. When the data signal DT1 is ECC-corrected, the determining section J outputs a data signal DT2 obtained by attaching information to that effect to the data signal DT1. On the other hand, if the data signal DT1 is not ECC-corrected, it outputs the data signal DT1 as it is. That is, the data signal DT1 is a signal containing data bits which are not ECC-corrected and the data signal DT2 is a signal containing data bits which are ECC-corrected.

The data signals DT1 and DT2 are supplied to the test section T2. The test section T2 makes the test for the data signals DT1 and DT2 in the same manner as in the first embodiment. If data signal DT1 is supplied during the test, the test section T2 performs the normal test operation.

When the data signal DT2 is supplied and if no error is present in the data bits in the data signal DT2, the test section T2 does not deal with a memory cell MC which stores data having the error as an object to be processed by use of the redundancy system. That is, the test section T2 does not supply the control signal CNT2 and address signal ADR to the redundancy system control section RC. The address signal ADR is a signal containing address information of the faulty memory cell MC. The control signal CNT2 is a signal indicating that one faulty memory cell MC or a group of memory cells MC containing the faulty memory cell (which are hereinafter simply referred to as faulty memory cells MC) is/are replaced by one redundant memory cell or redundant memory cells RMC (which are hereinafter collectively referred to as redundant memory cells RMC) based on the address signal ADR. The test section T2 supplies the address signal ADR to the storage section SR instead of supplying the same to the redundancy system control section RC and the storage section SR stores the information. The test section T2 makes a test for the next data bits in the data signal DT1.

If an error is further detected in the ECC-corrected data bits, the test section T2 supplies the control signal CNT2 and address signal ADR to the redundancy system control section RC. The redundancy system control section RC performs the replacement operation of replacing the faulty memory cells MC by a redundant memory cells RMC according to the control signal CNT2 and address signal ADR. After this, the test section T2 performs the operation of checking the next data bits in the data signal DT1.

The test section T2 repeatedly makes tests for the data bits to cover all of the memory cells MC by repeatedly performing the above operation. As a result, if all of the memory cells MC which are ECC-corrected and in which errors are further detected are replaced by the redundant memory cells RMC and available redundant memory cells RMC are still present, the process proceeds to the next stage. At this stage, the test section T2 reads out address information stored in the storage section SR and sequentially replaces the faulty memory cells MC by the redundant memory cells RMC by use of the control signal CNT2. As a result, when all of the faulty memory cells MC are replaced or the available redundant memory cells RMC are no more present, the test section T2 terminates the operation of controlling the replacement of the memory cells MC.

For example, all of the replacements are terminated, but in a case where a preset reference condition that a large number of faulty memory cells are present is not satisfied, for example, the test section T2 outputs a first determination signal S4 containing information to that effect.

According to the semiconductor device of the second embodiment, the BISR block BRB1 preferentially deals with the memory cells MC which are ECC-corrected and still contains a faulty memory cell as an object to be compensated for by use of the redundancy system. Then, if all of the above-described memory cells are replaced by the redundant memory cells RMC and available redundant memory cells RMC are still present, the memory cells MC in which further faulty memory cells are not detected as the result of ECC correction are replaced by the available redundant memory cells RMC. That is, the memory cells MC which cannot be corrected by use of the ECC system are first repaired (replaced) and then the memory cells MC which can be corrected by use of the ECC system are repaired. Therefore, the memory cells MC which cannot be sufficiently repaired by the ECC correction can be repaired without fail and the faulty memory cells MC which can be repaired by the redundancy system can be prevented from being ECC-corrected. As a result, the rate at which the capacity of the ECC system is used to repair the memory cells MC having faulty portions caused in the manufacturing process is made minimum and the capacity of the ECC system can be maintained to cope with soft errors.

It is also possible to provide a counter section C and determining section D which are the same as those of the first embodiment in the BISR block BRB1 and add the configuration of the first embodiment to the second embodiment.

Third Embodiment

An error correcting section of a third embodiment of the present invention is switched between a mode in which an ECC correction is not made and a mode in which the ECC correction is made.

FIG. 3 is a functional block diagram schematically showing a semiconductor device according to the third embodiment of the present invention. As shown in FIG. 3, a memory block MB3 includes a memory section M which is the same as that in the first embodiment and a redundant memory section RM and redundancy system control section RC which are the same as those in the second embodiment. Further, an error correcting section ECC2, BISR block BRB2 are provided.

A correcting section EC2 in the error correcting section ECC2 is switched between a mode (first mode) in which the ECC correction is not made and a mode (second mode) in which the ECC correction is made according to an enable signal EN. In the first mode, the error correcting section ECC2 supplies a data bit signal S1 and correction bit signal S2 supplied from the memory section M to the BISR block BRB2 as they are.

In the second mode, the error correcting section ECC2 corrects errors in the data bits by use of an error correcting bits and supplies a data signal DT1 on which the correction is reflected to the BISR block BRB2.

The BISR block BRB2 includes a counter section C and determining section D which are the same as those of the first embodiment and a test section T3. The test section T3 performs the same operation as that of the test section T2 and additionally has a function of generating an enable signal EN.

At the testing time, the test section T3 sets the error correcting section ECC2 into the first mode by use of the enable signal EN. Then, the test is made for the data bits in the data bit signal S1 and the error correcting bits in the correction bit signal S2. As the result of this, if a faulty memory cell MC is detected, the faulty memory cell MC is replaced by a redundant memory cell group RMC under control by the test section T3 and redundancy system control section RC.

In the first mode, the test section T3 sets the error correcting section ECC2 into the second mode by use of the enable signal EN after all of the memory cells MC are tested. While the error correcting section ECC2 is kept in the second mode, the same process as that in the first embodiment is performed by the BISR block BRB2 and error correcting section ECC2. That is, the test section T3 tests all of the data bits and error correcting bits and the counter section C counts the number of times by which the ECC correction is made. As the result of this, if the test section T3 determines that a memory block MB3 is faulty or the counting result of the counter section C reaches a preset upper limit, the determining section D outputs a signal S6.

According to the semiconductor device of the third embodiment, the test is made for the error correcting bits and data bits which are not ECC-corrected in the first mode and the faulty memory cells MC are replaced by the redundant memory cells RMC. Therefore, the faulty memory cells MC which can be repaired by use of the redundancy system can be prevented from being ECC-corrected and the capacity of the ECC system can be prevented from being used up to compensate for the faulty portions caused in the memory block MB3 in the manufacturing process.

Further, the second mode is set after the first mode was set and the same operation as that in the first embodiment is performed in the second mode. Therefore, like the effect obtained in the first embodiment, a semiconductor device which is highly resistant to soft errors can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a memory section including a first memory cell which stores a data bit and a second memory cell which stores an error correcting bit, an error correcting section which corrects an error of the data bit by use of the error correcting bit, outputs a data signal containing an error-corrected data bit and an information signal when the error is corrected, a test section which is supplied with the data signal containing the error-corrected data bit and the information signal and outputs a first determination signal when the memory section is determined to be faulty by checking the data signal containing the error-corrected data bit based on a stored program for determining whether the memory section functions normally, a counter section configured to receive the information signal from the error correcting section, count the number of times by which the information signal is supplied thereto, and output a second determination signal when the result of counting is equal to a predetermined reference value, and a determining section configured to receive the first determination signal from the test section and the second determination signal from the counter section and determine that the memory section is faulty when one of the first and second determination signals is supplied thereto, wherein the reference value of the counter section is determined to permit the error correcting section to attain a desired soft error rate by use of a capacity obtained by subtracting a capacity used to correct errors until the reference value is reached from a total capacity of the error correcting section which can be used to correct errors, and the test section, counter section, and determining section are included in a function block used for determining if the memory section is faulty.

2. The device according to claim 1, further comprising first and second function regions parted by a boundary region on a substrate, the memory section and error correcting section being formed in the first function region, the test section, counter section and determining section being formed in the second function region.

3. A semiconductor device comprising:

a memory section including a plurality of first memory cells each of which stores a data bit and a second memory cell which stores an error correcting bit, a redundant memory section including a plurality of redundant memory cells each of which can be used to replace the first memory cell and stores the data bit instead of the replaced first memory cell, a redundancy control section which performs a replacement operation which forms a signal path to replace the faulty first memory cell by the redundant memory cell according to a control signal, an error correcting section which corrects an error in a data bit group consisting of the data bits by use of the error correcting bit, outputs a first data signal containing an error-corrected data group and outputs an information signal when the error is corrected, a determining section configured to receive the first data signal from the error correcting section and the information signal from the error correcting section, monitor the information signal, and output a second data signal which has information attached to the first data signal and indicating that the first data signal contains the error-corrected data group when the first data signal contains the error-corrected data group, a test section which checks the second data signal containing the error-corrected data group based on a stored program for determining whether the memory section functions normally and outputs the control signal which controls the redundancy control section to replace the first memory cell which stores the data bit containing an error by the redundant memory cell when the error is detected in the data group of the second data signal, and a storage section configured to receive from the test section and store address information of the first memory cell which stores the data bit having an error corrected by the error correcting section when an error is not detected in the data group of the second signal as the checking result in the test section, wherein the determining section, test section, and storage section are included in a function block used for determining if the memory section is faulty.

4. The device according to claim 3, further comprising first and second function regions parted by a boundary region on a substrate, the memory section, redundant memory section, redundancy control section and error correcting section being formed in the first function region, the determining section and test section being formed in the second function region.

5. The device according to claim 4, wherein the storage section is formed in the second function region.

6. The device according to claim 3, wherein the memory section sequentially supplies a plurality of data groups whose data bits are stored in the first memory cells to the error correcting section for all of the first memory cells, the error correcting section sequentially supplies the plurality of first data signals to the determining section according to the plurality of data groups, the determining section sequentially supplies the plurality of second data signals to the test section according to the plurality of first data signals, the test section sequentially checks the plurality of second data signals, and the redundancy control section sequentially performs the replacement operation according to the result of an operation of the test section which has sequentially checked the second data signals.

7. The device according to claim 6, wherein the redundancy control section performs the replacement operation so that the first memory cell specified by the address information is replaced by one of the redundant memory cells when an unused redundant memory cell is still available after all faulty first memory cells which store an error bit found in all error-corrected data groups are replaced with redundant memory cells.

8. A semiconductor device comprising:

a memory section including a plurality of first memory cells each of which stores a data bit and a second memory cell which stores an error correcting bit and outputting a first signal which contains a data group containing a plurality of the data bits and a second signal which contains the error correcting bit, a redundant memory section including a plurality of redundant memory cells each of which can be used to replace the first memory cell and stores the data bit instead of the replaced first memory cell, a redundancy control section which performs a replacement operation which forms a signal path to replace the faulty first memory cell by the redundant memory cell according to a control signal, an error correcting section which is supplied with the first and second signals, has a first mode and second mode, outputs the first and second signals as they are in the first mode, corrects an error in the data group by use of the error correcting bit and outputs a first data signal containing an error-corrected data group in the second mode, and outputs an information signal when the error is corrected, a test section which checks the first signal based on a stored program for determining whether the memory section functions normally in the first mode and outputs the control signal which controls the redundancy control section to replace the first memory cell which stores the data bit containing an error by the redundant memory cell when the error is detected in the data group of the first signal, and a counter section configured to receive the information signal from the error correcting section, count the number of times by which the information signal is supplied thereto, and output a first determination signal when the result of counting is equal to a predetermined reference value, wherein the reference value of the counter section is determined to permit the error correcting section to attain a desired soft error rate by use of a capacity obtained by subtracting a capacity used to correct errors until the reference value is reached from a total capacity of the error correcting section which can be used to correct errors, and the test section and counter section are included in a function block used for determining if the memory section is faulty.

9. The device according to claim 8, further comprising first and second function regions parted by a boundary region on a substrate, the memory section, redundant memory section, redundancy control section and error correcting section being formed in the first function region, the test section being formed in the second function region.

10. The device according to claim 9, wherein the test section further has a function of outputting a second determination signal when the memory section is determined to be faulty by checking the first data signal containing an error-corrected data group based on the program previously stored therein in the second mode and, the device further comprising:

a determining section configured to receive the first determination signal from the counter section and the second determination signal from the test section and determine that the memory section is faulty when one of the first and second determination signals is supplied thereto.

11. The device according to claim 10, wherein the determining section is formed in the second function region.

12. The device according to claim 8, wherein the test section outputs an enable signal which controls switching between the first and second modes of the error correcting section.

* * * * *